United States Patent
Hendrix et al.

(10) Patent No.: US 9,842,873 B2
(45) Date of Patent: *Dec. 12, 2017

(54) VARIABLE OPTICAL FILTER AND A WAVELENGTH-SELECTIVE SENSOR BASED THEREON

(71) Applicant: Viavi Solutions Inc., Milpitas, CA (US)

(72) Inventors: Karen Denise Hendrix, Santa Rosa, CA (US); Charles A. Hulse, Sebastopol, CA (US); Richard A. Bradley, Santa Rosa, CA (US); Jeffrey James Kuna, San Francisco, CA (US)

(73) Assignee: Viavi Solutions Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/337,489

(22) Filed: Oct. 28, 2016

(65) Prior Publication Data

US 2017/0047366 A1    Feb. 16, 2017

Related U.S. Application Data

(60) Continuation of application No. 15/017,583, filed on Feb. 5, 2016, now Pat. No. 9,515,119, which is a (Continued)

(51) Int. Cl.
*H01L 27/146* (2006.01)
*G02B 5/28* (2006.01)

(52) U.S. Cl.
CPC ........ *H01L 27/14621* (2013.01); *G02B 5/281* (2013.01); *G02B 5/288* (2013.01);
(Continued)

(58) Field of Classification Search
CPC combination set(s) only.
See application file for complete search history.

(56) References Cited

U.S. PATENT DOCUMENTS 4,790,615 A    12/1988    Seki
4,957,371 A     9/1990    Pellicori
(Continued)

FOREIGN PATENT DOCUMENTS

CN    101882625    11/2010
TW    200951495    12/2009

OTHER PUBLICATIONS

International Search Report for PCT/US2014/013449 dated May 2, 2014, 3 pages.
(Continued)

*Primary Examiner* — Kyoung Lee
*Assistant Examiner* — Ratisha Mehta
(74) *Attorney, Agent, or Firm* — Harrity & Harrity, LLP

(57) ABSTRACT

A variable optical filter is disclosed including a bandpass filter and a blocking filter. The bandpass filter includes a stack of alternating first and second layers, and the blocking filter includes a stack of alternating third and fourth layers. The first, second and fourth materials each comprise different materials, so that a refractive index of the first material is smaller than a refractive index of the second material, which is smaller than a refractive index of the fourth material; while an absorption coefficient of the second material is smaller than an absorption coefficient of the fourth material. The materials can be selected to ensure high index contrast in the blocking filter and low optical losses in the bandpass filter. The first to fourth layers can be deposited directly on a photodetector array.

20 Claims, 11 Drawing Sheets

Related U.S. Application Data division of application No. 14/166,747, filed on Jan. 28, 2014, now Pat. No. 9,261,634.

(60) Provisional application No. 61/757,846, filed on Jan. 29, 2013.

(52) U.S. Cl.
CPC .... *H01L 27/1463* (2013.01); *H01L 27/14623* (2013.01); *H01L 27/14634* (2013.01); *H01L 27/14643* (2013.01); *H01L 27/14685* (2013.01)

(56) References Cited

U.S. PATENT DOCUMENTS

| | | | |
|---|---|---|---|
| 5,218,473 | A | 6/1993 | Seddon et al. |
| 5,872,655 | A | 2/1999 | Seddon et al. |
| 5,926,317 | A | 7/1999 | Cushing |
| 6,057,925 | A | 5/2000 | Anthon |
| 6,091,502 | A | 7/2000 | Weigl et al. |
| 6,700,690 | B1 | 3/2004 | Buchsbaum et al. |
| 7,576,860 | B2 | 8/2009 | Wu et al. |
| 9,261,634 | B2 | 2/2016 | Hendrix et al. |
| 2002/0191268 | A1 | 12/2002 | Seeser |
| 2005/0205758 | A1 | 9/2005 | Almeida |
| 2008/0285165 | A1 | 11/2008 | Wu |
| 2010/0051785 | A1 | 3/2010 | Dai |
| 2010/0187557 | A1 | 7/2010 | Samoilov et al. |
| 2011/0038028 | A1 | 2/2011 | Dharmatilleke |
| 2011/0170164 | A1 | 7/2011 | Wang et al. |
| 2011/0206900 | A1 | 8/2011 | Iwase |
| 2011/0222060 | A1 | 9/2011 | Smith et al. |
| 2011/0234830 | A1 | 9/2011 | Kiyota |
| 2011/0310472 | A1 | 12/2011 | Hiral |
| 2016/0172416 | A1 | 6/2016 | Hendrix et al. |

OTHER PUBLICATIONS

Cabib et al., "Revival of Circular Variable Filters", Oct. 20, 2010, Proc. of SPIE vol. 7835 78350O-1, pp. 1-10, XP040545033.

Piegari A et al: "Thin film filters with variable transmittance for spectrometry" Jun. 22, 2005, pp. 109-114, XP010813750.

Shumei Yang : "Circular, variable, broad-bandpass filters with induced transmission at 200-1100 nm", vol. 32, No. 25, Sep. 1, 1993, pp. 4836-4842, XP000388200.

CVI Melles Griot "Fundamental Optics Gaussian Beam Optics Optical Specifications Material Properties Optical Coatings", Feb. 24, 2012, pp. 537-542, XP055301957, URL:https://marketplace.idexop.corTVFrontend/PDFs/interference_filter_coatings.pdf.

Extended European Search Report corresponding to EP 14746665 dated Sep. 20, 2016, 9 pages.

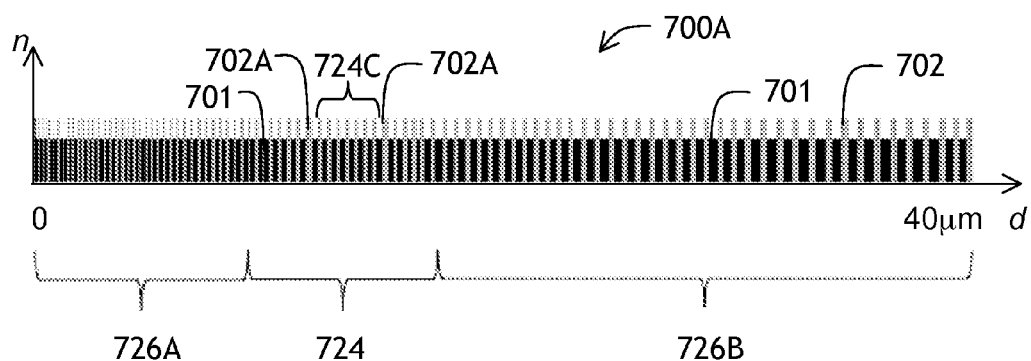
FIG. 7A
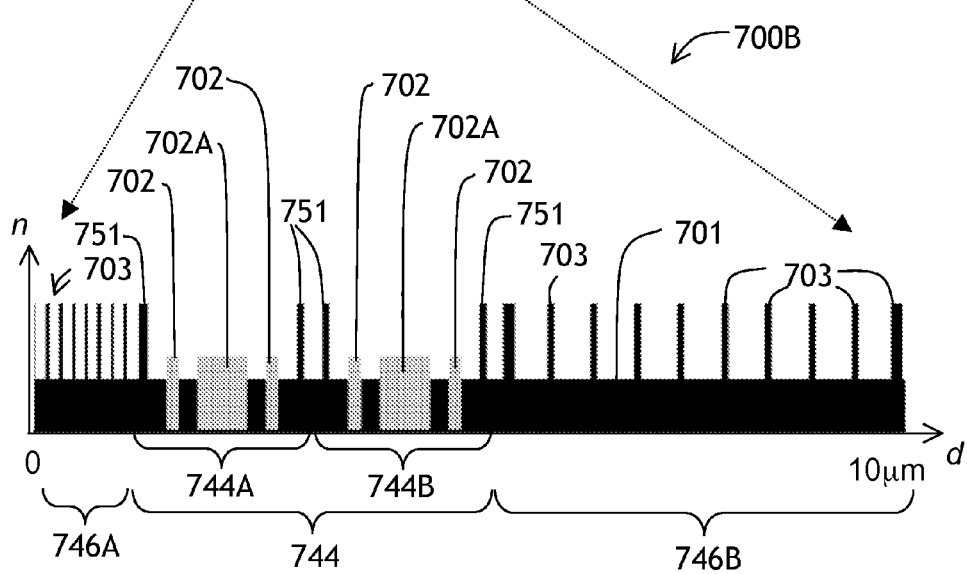
FIG. 7B
FIG. 7C

VARIABLE OPTICAL FILTER AND A WAVELENGTH-SELECTIVE SENSOR BASED THEREON

CROSS-REFERENCE TO RELATED APPLICATIONS

This application is a continuation of U.S. patent application Ser. No. 15/017,583, filed Feb. 5, 2016, which is a divisional of U.S. patent application Ser. No. 14/166,747, filed Jan. 28, 2014 (now U.S. Pat. No. 9,261,634), which claims priority from U.S. Provisional Patent Application No. 61/757,846 filed Jan. 29, 2013, the disclosures of which are incorporated herein by reference.

TECHNICAL FIELD

The present invention relates to optical filters, and in particular to optical filters having spatially varying spectral characteristics.

BACKGROUND OF THE INVENTION

A spatially variable optical filter has a transmission wavelength varying in a transverse direction across the filter. A compact optical spectrometer can be constructed by attaching a photodetector array to a spatially variable optical filter. A filter having the transmission wavelength varying linearly with distance in a transverse direction across the filter is called a linearly variable filter (LVF). Linear variation of the transmission wavelength with distance is convenient, although not necessary. Optical spectra obtained using an LVF and a constant-pitch photodetector array have a constant wavelength step.

Pellicori et al. in U.S. Pat. No. 4,957,371 disclose a wedge-filter spectrometer including a LVF having a first plurality of layers of high index of refraction material and a second plurality of layers of low index of refraction material, individual high- and low-index layers overlapping each other and having a substantially linearly tapered thickness, to form a linearly variable optical thin film interference filter. A photodetector array is attached to the LVF, resulting in a very compact overall construction.

Anthon in U.S. Pat. No. 6,057,925 discloses a compact spectrometer device including a thin film interference LVF and a photodetector array coupled to the LVF via an array of gradient-index lenses or an array of microlenses, for use in a color sensing device, such as a portable colorimeter. Lightweight and robust construction of the thin film interference LVF-based spectrometer allows the portable colorimeter to characterize color of articles in field conditions.

Weigl et al. in U.S. Pat. No. 6,091,502 disclose a compact LVF-based spectrometer for performing fluorescence and absorption spectral measurements in flow cells with spatial resolution. By placing the LVF in an optical path, such that the transmission variation of the filter occurs in the flow direction, it is possible to spectroscopically determine concentration of dye markers of proteins in a flow of biological cells.

Referring to FIG. 1A, a typical prior-art compact optical spectrometer 100, similar to those used in Pellicori, Anthon, and Weigl devices, includes a LVF 102 optically coupled to a photodetector array 104. Transmission wavelength $\lambda_T$ varies in a direction 106 across the LVF 102. In operation, light 108 impinges onto the LVF 102. The LVF 102 passes through only a narrow wavelength band around the transmission wavelength $\lambda_T$, which varies in the direction 106 parallel to the photodetector array 104. As a result, each photodetector 105 of the photodetector array 104 is responsive to a different wavelength band of the light 108. By measuring photocurrents of each photodetector 105 of the photodetector array 104, an optical spectrum of the light 108 can be obtained.

The LVF 102 includes a thin film stack 112 supported by a substrate 110. Referring to FIG. 1B, the thin film stack 112 includes two regions: a block region 121 for blocking wavelengths shorter than and longer than $\lambda_T$, and a bandpass region 122 for transmitting only a narrow passband centered around $\lambda_T$. Each of the two regions 121 and 122 includes alternating high-index layers 131 and low-index layers 132 having high and low refractive indices, respectively. The materials of the high-index 131/low-index 132 layers are the same across the regions 121 and 122, only the thicknesses are varied to achieve the optical performance required. The blocking region 121 includes quarter-wave stacks for blocking wavelengths other than $\lambda_T$, and the bandpass region 122 half-wave stacks for transmitting the narrow passband centered around $\lambda_T$. The material combinations in the material pair can include metal oxides or fluorides.

One drawback of the LVF 102 is an inherent tradeoff between optical performance of the LVF 102 and the overall thickness of the thin film stack 112. To ensure good blocking of the wavelengths other than $\lambda_T$, the blocking region 121 has to include many layers. For low-loss oxides, the number of layers can be up to a hundred layers. To ensure narrow passband around $\lambda_T$, the bandpass region 122 also needs to include many layers, and/or to include a thick central layer. Large thickness of the thin film stack 112 results in an increase of internal stresses in the thin film stack 112, causing it to break and/or delaminate from the substrate 110. High-index material, such as silicon, can be used to reduce the overall number of layers. However, high-index materials typically increase optical loss of the LVF 102.

SUMMARY OF THE INVENTION

It is a goal of the invention to alleviate the tradeoff between thickness and optical performance of a variable optical filter.

The inventors have realized that key optical requirements for materials in blocking and bandpass regions of a variable optical filter differ from each other in the following manner. In the blocking region, high index contrast is a key requirement. The high index contrast allows one to reduce the number of layers and increase the blocking efficiency. In the bandpass region, low loss is more important than the high index contrast, because light undergoes multiple reflections in that region, traversing the layers of the bandpass region many more times than in the blocking layer. Therefore, providing low-loss, but comparatively low-index material combinations in the bandpass region, together with high index contrast, but comparatively lossy material combinations in the blocking region, can result in a thin, low-stress variable optical filter having simultaneously a low optical loss, a narrowband transmission peak, and strong out-of-band rejection.

In accordance with the invention, there is provided an optical filter having a laterally variable transmission wavelength within a wavelength range, the optical filter comprising:

a bandpass filter comprising a stack of alternating first and second layers comprising first and second materials, respectively, and having laterally varying thicknesses for providing the laterally variable transmission wavelength;

a blocking filter comprising a stack of alternating third and fourth layers comprising third and fourth materials, respectively, and having laterally varying thicknesses coordinated with the laterally varying thicknesses of the first and second dielectric layers, for blocking wavelengths within the wavelength range that are larger or smaller than the laterally variable transmission wavelength;

wherein the first, second and fourth materials each comprise different materials, so that a refractive index of the first material is smaller than a refractive index of the second material, the refractive index of the second material is smaller than a refractive index of the fourth material, and an absorption coefficient of the second material is smaller than an absorption coefficient of the fourth material.

Advantageously, the bandpass filter further includes at least one fifth layer comprising the fourth material and disposed in an area of a local minimum of a standing optical wave inside the bandpass filter, whereby a blocking wavelength region of the bandpass filter is broadened, and a thickness of the bandpass filter is reduced.

In one embodiment, the transmission wavelength is monotonically variable along a length dimension of the optical filter. In a preferred embodiment, the transmission wavelength is logarithmically variable along the length dimension. The first and third materials can include a same material. The optical filter can include three, four, or more different materials.

In accordance with the invention, there is further provided a wavelength-selective sensor comprising the optical filter as described above, and an array of photodetectors coupled to the optical filter. The photodetectors are spaced apart along the length dimension. As a result, different photodetectors of the array are responsive to different wavelengths of light impinging on the optical filter from a side opposite to the array.

Preferably, the array of photodetectors comprises a substrate for the optical filter. The array of photodetectors is provided, and the first to fifth layers are deposited directly onto the array, so as to form the bandpass and blocking filters, respectively, supported by the array. Among advantages of depositing the optical filter directly onto the photodetector array are increased spectral resolution due to light not having to propagate through a separate bulk substrate, reduced light leakage between neighboring photodetectors, and improved reliability. The optical filter can also be manufactured separately and affixed directly to the array, e.g. bonded with an optical epoxy.

In accordance with another embodiment of the invention, there is further provided a wavelength-selective sensor, wherein the photodetector array comprises a device chip having opposed first and second surfaces. The photodetectors of the array are disposed in the first surface of the device chip, and the optical filter is disposed on the first surface, over the photodetectors. Such a wavelength-selective sensor may be produced by (A) manufacturing the device chip by
(i) providing a device wafer having first and second opposing surfaces;
(ii) forming in the second surface of the device wafer the photodetectors of the array facing towards the first surface;
(iii) polishing the first surface of the device wafer to expose the photodetectors of the array; and
(B) depositing on the first surface of the device wafer polished in step (iii) the first to fifth layers, so as to form the bandpass filter and the blocking filter of the optical filter.

In accordance with another embodiment of the invention, there is further provided a method of manufacturing a wavelength-selective sensor, comprising:

(a) providing an array of photodetectors;
(b) depositing on the array of photodetectors
a bandpass filter comprising a stack of alternating first and second layers comprising first and second materials, respectively, and having laterally varying thicknesses for providing the laterally variable transmission wavelength; and
a blocking filter comprising a stack of alternating third and fourth layers, comprising third and fourth materials, respectively, and having laterally varying thicknesses coordinated with the laterally varying thicknesses of the first and second dielectric layers, for blocking wavelengths within the wavelength range that are larger or smaller than the laterally variable transmission wavelength;

wherein the first, second and fourth materials each comprise different materials, so that a refractive index of the first material is smaller than a refractive index of the second material, the refractive index of the second material is smaller than a refractive index of the fourth material, and an absorption coefficient of the second material is smaller than an absorption coefficient of the fourth material.

In one embodiment, step (a) includes:
(i) providing a device wafer having first and second opposing surfaces;
(ii) forming in the second surface of the device wafer the array of photodetectors facing the first surface; and
(iii) polishing the first surface of the device wafer to expose the photodetectors of the array,
wherein in step (b), the bandpass and blocking filters are deposited in the first surface of the device wafer polished in step (iii).

BRIEF DESCRIPTION OF THE DRAWINGS

Exemplary embodiments will now be described in conjunction with the drawings, in which:

FIGS. 7A and 7B are spatial refractive index plots of a variable optical filter including low-loss oxides only (FIG. 7A) and a combination of the materials according to the invention (FIG. 7B), drawn to a same scale;

FIG. 7C is an enlarged view of the spatial refractive index plot of FIG. 7B;

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figures 1A, 1B:
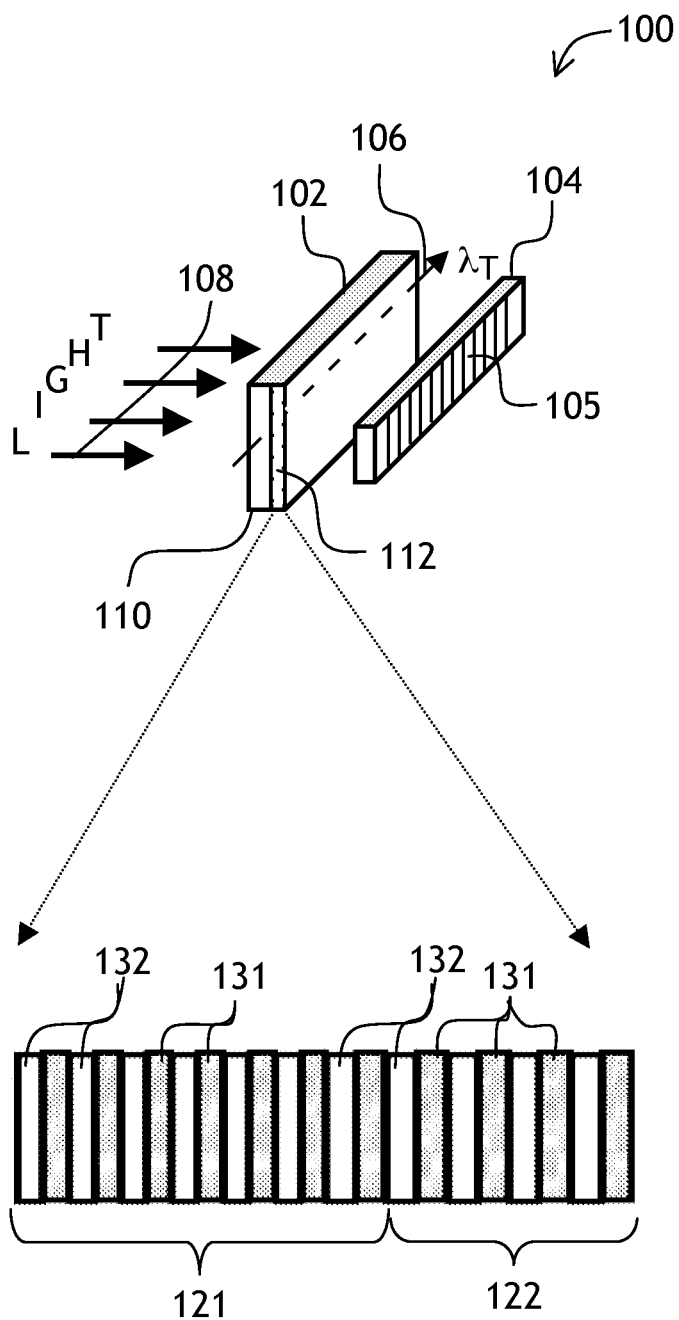
FIG. 1A is a three-dimensional view of a prior-art optical spectrometer based on a thin-film LVF.
FIG. 1B is an enlarged cross-sectional view of the thin film structure of the LVF of FIG. 1A.
Figure 2:
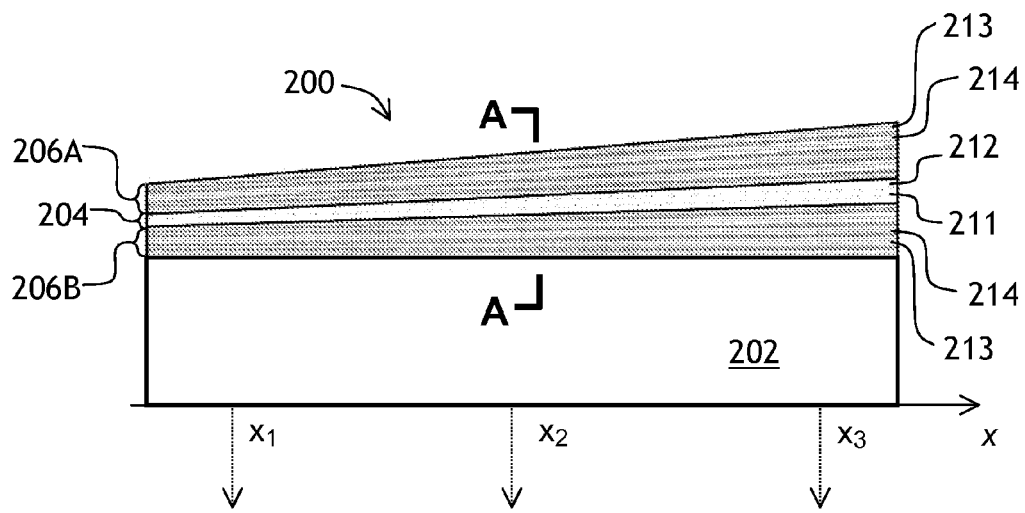
FIG. 2 is a cross-sectional view of a variable optical filter of the invention on a substrate.
Figure 3A:
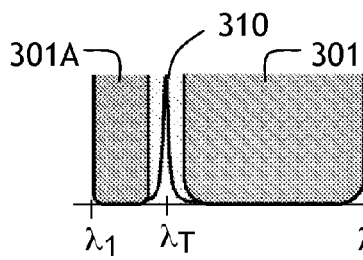
FIGS. 3A to 3C are transmission spectra of blocking and bandpass filter sections of the variable optical filter of FIG. 2 at different locations along a direction of the transmission wavelength variation.
Figure 3B:
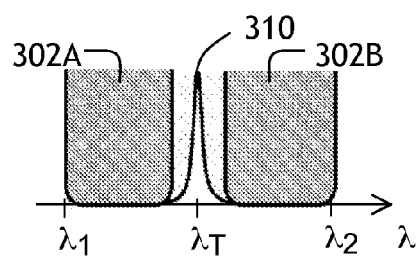
Figure 3C:
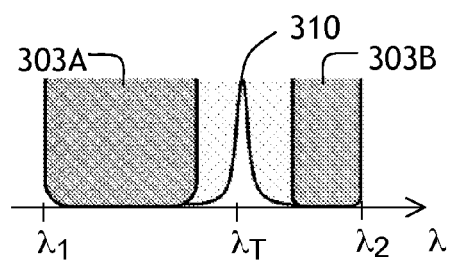

Referring to FIG. 2 and FIGS. 3A, 3B, and 3C, an optical filter 200 (FIG. 2) has a narrow passband 310 (FIGS. 3A to 3C) at a laterally variable transmission wavelength $\lambda_T$ within a wavelength range between $\lambda_1$ and $\lambda_2$. The transmission wavelength $\lambda_T$ is variable in a direction x shown in FIG. 2. The optical filter 200 can be disposed on a transparent substrate 202. The variable optical filter 200 includes a bandpass filter 204 and blocking filters 206A, 206B disposed over the substrate 202. The bandpass filter 204 comprises a stack of alternating first 211 and second 212 layers including first and second materials, respectively. The first 211 and second 212 layers have thicknesses varying laterally in the direction x (FIG. 2), for providing the laterally variable transmission wavelength $\lambda_T$ of the passband 310. The transmission wavelength $\lambda_T$ varies in an approximate proportion to the local thicknesses of the first 211 and second 212 layers. For example, the transmission wavelength $\lambda_T$ is close to the shortest wavelength $\lambda_1$ of the wavelength range $(\lambda_1, \lambda_2)$ at a coordinate $x_1$ (FIGS. 2 and 3A); is in the middle of the wavelength range $(\lambda_1, \lambda_2)$ at a coordinate $x_2$ (FIGS. 2 and 3B); and is close to the longest wavelength $\lambda_2$ of the wavelength range $(\lambda_1, \lambda_2)$ at a coordinate $x_3$ (FIGS. 2 and 3C).

The blocking filters 206A, 206B each include a stack of alternating third 213 and fourth 214 layers including third and fourth materials, respectively. The third 213 and fourth 214 layers have laterally varying thicknesses coordinated with the laterally varying thicknesses of the first 211 and second 212 layers, for blocking wavelengths within the wavelength range $(\lambda_1, \lambda_2)$ that are shorter or longer than the laterally variable transmission wavelength $\lambda_T$. Specifically, the top blocking filter 206A is for blocking wavelength shorter than $\lambda_T$ (left-side bands 301A, 302A, and 303A in FIGS. 3A, 3B, and 3C, respectively), and the bottom blocking filter 206B is for blocking wavelength longer than $\lambda_T$ (right-side bands 301B, 302B, and 303B in FIGS. 3A, 3B, and 3C, respectively).

According to the invention, the first, second, and third materials of the first 211, second 212 and fourth 214 layers, respectively, all include different materials. Typically, the first and second materials include dielectric materials, and the third and fourth materials include dielectric or semiconductor materials. The refractive index of the first material is smaller than the refractive index of the second material. The refractive index of the second material is smaller than the refractive index of the fourth material. The absorption coefficient of the second material is smaller than an absorption coefficient of the fourth material. In other words, the fourth material, although having the highest refractive index of all four, can also be somewhat absorptive. For example, a semiconductor material such a silicon can be used for the fourth material. The first and third materials can, but do not have to, include a same low-index material e.g. silicon dioxide. The second material can include a high-index oxide such as tantalum pentoxide, for example. As a guideline, the refractive index of the first and third materials can be between 1.35 and 1.6, the refractive index of the second material can be between 1.8 and 2.5, and the refractive index of the fourth material can be between 2.6 and 4.5.

Using different materials for the first 211 and second 212 layers of the bandpass filter 204, and for the fourth layer 214 of the blocking filters 206A, 206B allows independent optimization of optical parameters of the bandpass filter 204 and the blocking filter 206A, 206B, as will be explained in detail below. Of course, the blocking filters 206A, 206B can also be disposed next to each other, forming a single blocking filter, with the bandpass filter 204 supported by the single blocking filter supported by the substrate 202. Furthermore, the thicknesses of the layers 211 to 214 shown in FIG. 2 can increase non-linearly, in going from left to right in the direction x, to provide a non-linearly laterally variable transmission wavelength $\lambda_T$ of the optical filter 200. In one embodiment, the transmission wavelength $\lambda_Y$ is logarithmically variable along the length direction x. The logarithmic variation of the transmission wavelength $\lambda_T$ results in a constant resolving power along the direction x when a constant-pitch photodetector array is disposed along the x-direction. The resolving power is defined as $R=\lambda_T/\Delta\lambda$, wherein $\Delta\lambda$ is a transmission bandwidth.

Figures 4A, 4B:
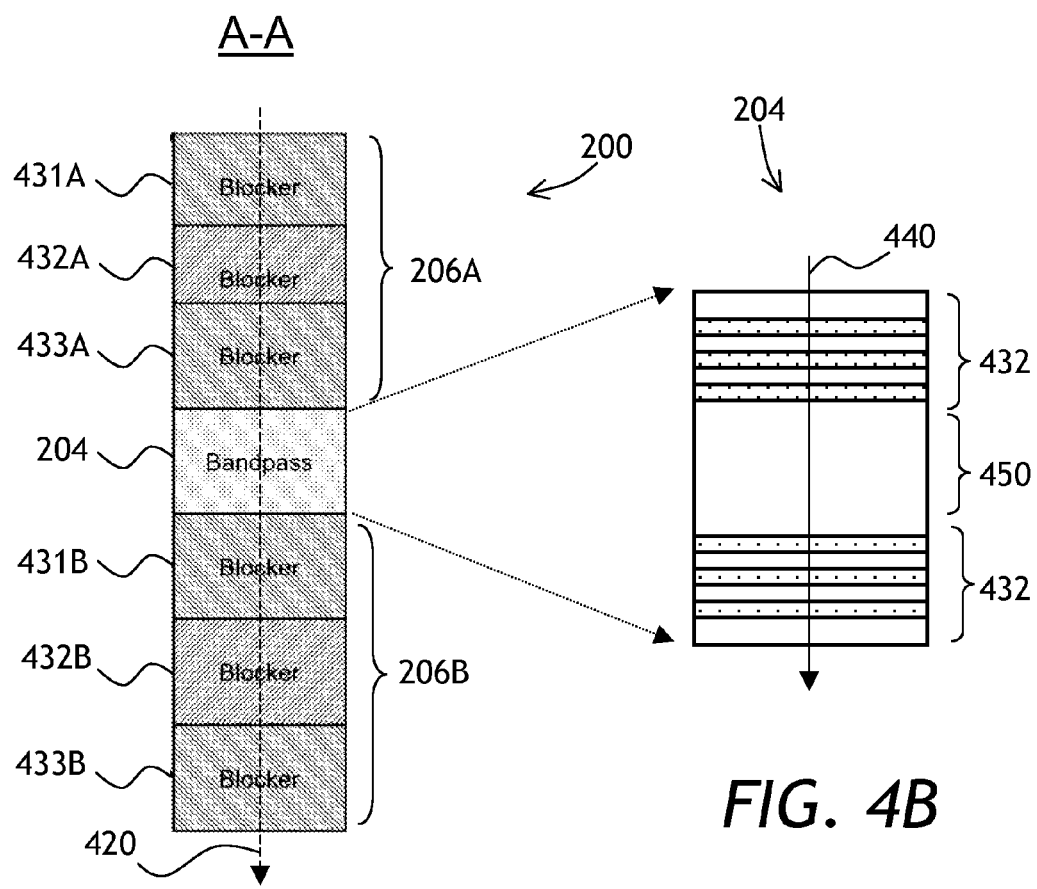
FIG. 4A is a schematic cross-sectional view of the filter of FIG. 2 taking along the lines A-A in FIG. 2, showing the bandpass filter and blocking filter sections.
FIG. 4B is a magnified cross-sectional view of the bandpass section of the filter of FIG. 4A.

Referring to FIG. 4A, a sectional view A-A of the variable optical filter 200 of FIG. 2 shows the bandpass filter 204, disposed in an optical path 420 between the first 206A and second 206B blocking filters, for blocking wavelengths shorter and longer than the transmission wavelength $\lambda_T$, respectively, of the bandpass filter 204. Each blocking filter 206A and 206B includes three portions 431A, 432A, and 433A; and 431B, 432B, and 433B, respectively. The thickness of the bandpass filter 204 and the blocking filter portions 431A to 433A; and 431B to 433B varies in a coordinated fashion, in the direction x perpendicular to the plane of FIG. 4A, as best seen in FIG. 2.

The blocking bands (not shown) of the blocking filter portions 431A to 433A; and 431B to 433B are cascaded to cover a broader wavelength range. Typically, it is the blocking wavelength range that dictates the usable wavelength range $(\lambda_1, \lambda_2)$ of the variable optical filter 200. At the long wavelength edge $\lambda_2$, the blocking of the portions 431B to 433B of the second blocking filter 206B must extend between $\lambda_T$ and $\lambda_2$, and at the short wavelength edge $\lambda_1$, the blocking of the portions 431A to 433A of the first blocking filter 206A must extend between $\lambda_1$ and $\lambda_T$. The out-of-band wavelength blocking afforded by the blocking filters 206A and 206B is particularly important when the optical frequency range of the optical filter 200 spans over one octave, because etalon-type optical filters have multiple transmission peaks separated by octaves of optical frequency.

Referring to FIG. 4B, the bandpass filter 204 includes a dielectric spacer layer 450 that is a multiple of half-waves at the desired center wavelength $\lambda_T$, sandwiched between quarter-wave reflector stacks 432 at the wavelength $\lambda_T$. The bandwidth of the bandpass filter 204 is made narrow by increasing the reflectivity of the quarter-wave stacks 432 and/or by increasing the thickness, or the number of half-waves, of the spacer layer 450. In either case, the transmission bandwidth is reduced by increasing the number of travels of light 440 across the spacer layer 432. Therefore, it is important that the spacer layer 450 material, and adjacent layers of the quarter-wave reflector stacks 432, have low optical loss.

Referring back to FIG. 4A with further reference to FIG. 4B, the variable optical filter 200 (FIG. 4A) is typically used with light that contains a range of angles of incidence, or a cone of light. To reduce the effect of shift of the transmission wavelength with an angle of incidence, it is preferred that the refractive index of the spacer layer 450 material (FIG. 4B) be as high as possible. To that end, a high-index refractory oxide, such as tantalum pentoxide ($Ta_2O_5$), niobium pentoxide ($Nb_2O_5$), an alloy of tantalum pentoxide and niobium pentoxide, or titanium dioxide ($TiO_2$), can be used. Metal oxides generally have a very low optical loss, and tantalum pentoxide, niobium pentoxide, and titanium dioxide have the refractive index above 2.0 in the wavelength range of interest, between 900 nm and 1700 nm. A suitable low-index material used for the reflector stacks 432 is silicon dioxide ($SiO_2$), having the refractive index of around 1.5 in the above wavelength range. It is noted that the bandpass filter 204 and/or the blocking filters 431A, 431B, 432A, 432B, and 433A, 433B can include different high index materials, and different low index materials. For example, the bandpass filter 204 can include a combination of silicon dioxide ($SiO_2$) and tantalum pentoxide ($Ta_2O_5$), and the blocking filters 431A, 431B, 432A, 432B, and 433A, 433B can include a combination of magnesium fluoride ($MgF_2$) and silicon (Si). Four or more material types can be used, depending upon targeted spectral performance of the optical filter 200.

The degree of light blocking and bandwidth of the blocking filter portions 431A to 433A and 431B to 433B is set by so called index contrast, or a ratio of the refractive indices of high and low-index layers of the blocking filter portions 431A to 433A and 431B to 433B. By increasing the index contrast, the overall thickness of the blocking filter portions 431A to 433A and 431B to 433B can be reduced dramatically, both because fewer layers are needed to achieve a desired blocking level, and because the blocking filter portions 431A to 433A and 431B to 433B will have a wider bandwidth, so that fewer stacks are needed to cover a desired bandwidth. The light 440 (FIG. 4B) propagating along the optical path 420 (FIG. 4A) does not travel across the blocking filter portions 431A to 433A and 431B to 433B as many times as in the bandpass filter 204, so a wider range of materials can be used, and specifically, silicon (Si) is preferably used. Silicon has the refractive index of over 3.0, and can be used as the high index material, even though is has some optical absorption in the wavelength range between 900 nm and 1700 nm. It is also naturally compatible with silicon dioxide, which has low refractive index, thus providing the sought-for high index contrast in the blocking filter portions 431A to 433A and/or 431B to 433B.

Figure 5A:
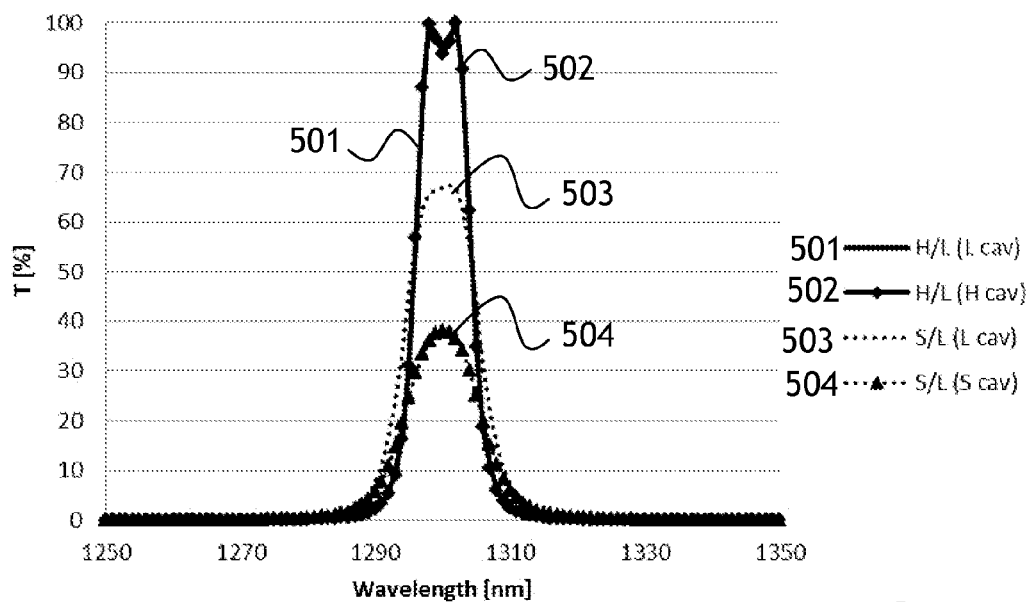
FIGS. 5A and 5B are transmission spectra of the bandpass filter section made of different materials, at illumination with collimated light (FIG. 5A) and at illumination with diverging or converging light (FIG. 5B)
Figure 5B:
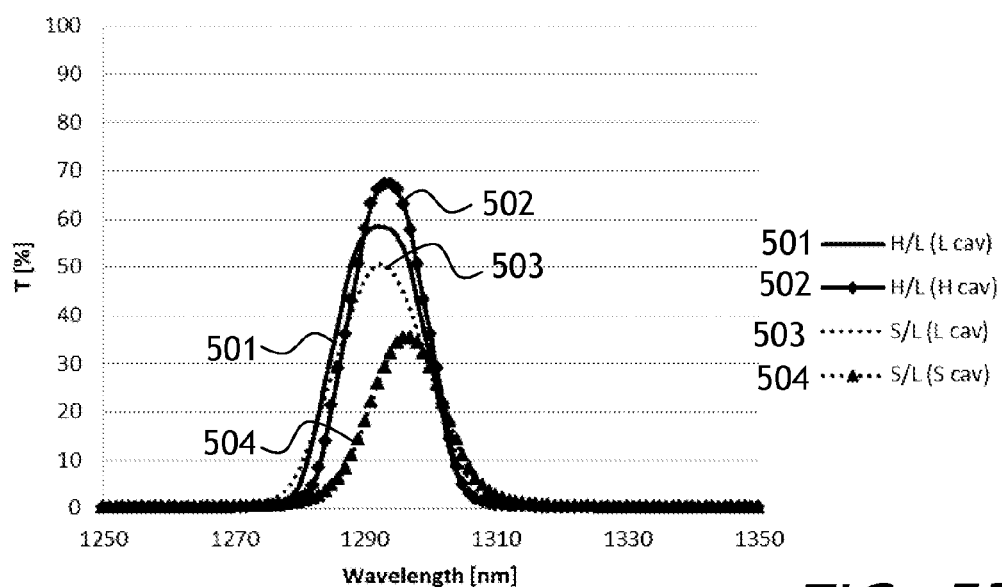

The above conclusions about wavelength selectivity and optical loss of different material systems have been confirmed experimentally, by growing multilayer stacks and measuring their transmission properties. Referring to FIGS. 5A and 5B, optical transmission spectra in collimated light (FIG. 5A) and non-collimated or "cone" light (FIG. 5B) of the bandpass filter 204 manufactured using different material combinations, are presented. In FIGS. 5A and 5B, "H/L" denotes high-index/low-index material combination of tantalum pentoxide and silicon dioxide, and "S/L" denotes the material combination of silicon and silicon dioxide. Accordingly, "L cav" denotes the "cavity", or the spacer layer 450 made of the low-index material, that is, silicon dioxide. "H cav" denotes the spacer layer 450 made of tantalum pentoxide. "S cav" denotes the spacer layer 450 made of silicon.

Referring specifically to FIG. 5A, spectra 501 and 502 correspond to the material combination of tantalum pentoxide and silicon dioxide with the silicon dioxide and tantalum pentoxide spacer layer 450, respectively. One can see that in collimated light, the spectra 501 and 502 are practically indistinguishable from each other and show a very high (approaching 100%) maximum transmission. Spectra 503 and 504 correspond to the material combination of silicon and silicon dioxide with the silicon dioxide and silicon spacer layer, respectively. The spectrum 503, corresponding to the silicon dioxide spacer layer 450, shows a higher maximum transmission (about 67%), than the spectrum 504 corresponding to the silicon spacer layer 450 (about 38%). This is because, as noted above, silicon has much higher optical absorption than either silicon dioxide or tantalum pentoxide and, since the light 440 (FIG. 4B) traverses the spacer layer 450 many times, the difference in the optical transmission becomes very noticeable (in this example 38% or 67% vs. 100%).

Turning now to FIG. 5B, all spectra 501 to 504 show increased optical loss due to the cone light illumination. Out of the first two spectra 501 and 502, the second spectrum 502, corresponding to the tantalum pentoxide spacer layer 450, shows a lower transmission drop of about 32% (from 100% to about 68% maximum transmission) than the first spectrum 501 corresponding to the silicon dioxide spacer layer 450, showing a 41% transmission drop (from 100% to about 59% maximum transmission). As explained above, the higher the refractive index of the spacer layer 450 material, the smaller the angular sensitivity of the bandpass optical filter 204. A similar trend is observed in the other two optical spectra 503 and 504, corresponding to silicon/silicon dioxide material combinations. For the spectrum 504, corresponding to the silicon spacer layer 450, the optical transmission drops by only about 3% (from 38% to 35%), while for the spectrum 503, corresponding to the silicon dioxide spacer layer 450, the optical transmission drops by about 17% (from 67% to 50% transmission). Thus, low-loss, but high refractive index material should be selected for the spacer layer 450 of the bandpass optical filter 204.

Figure 6:
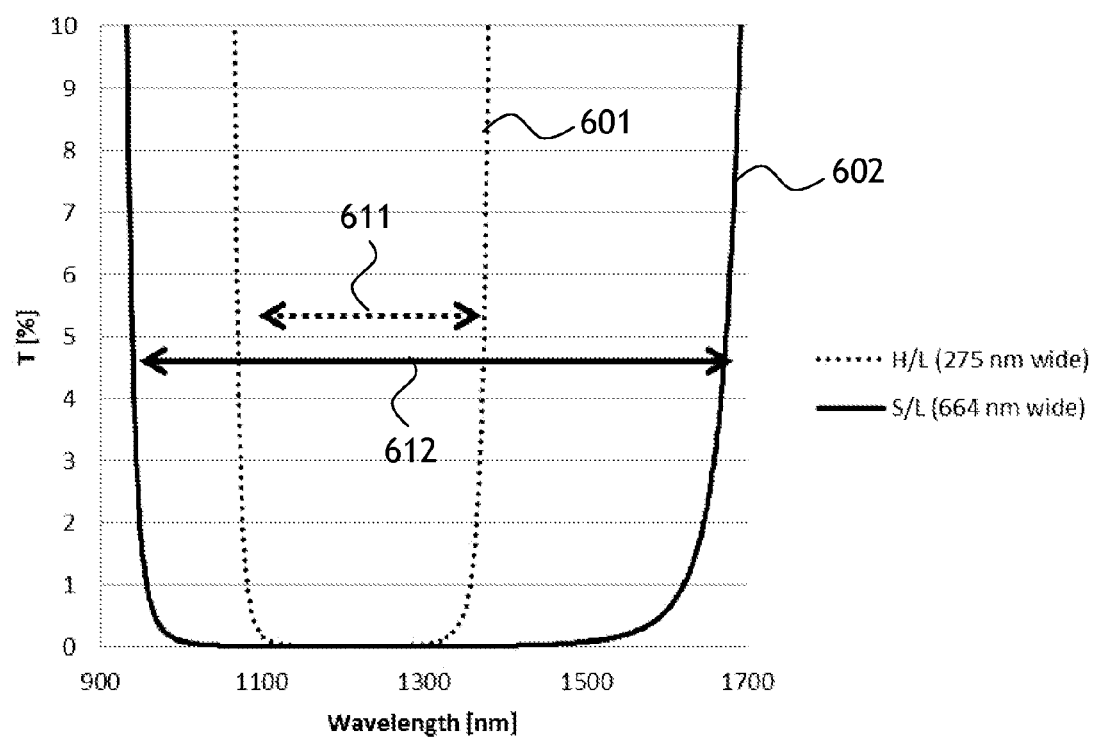
FIG. 6 are transmission spectra of the blocking filter made of different materials.

Referring now to FIG. 6 with further reference to FIG. 4A, transmission spectra 601 and 602 of the lower blocking filter 206B made out of tantalum pentoxide/silicon dioxide and silicon/silicon dioxide material combinations, respectively, are presented. A bandwidth 611 of the first spectrum 601 is only 275 nm, which is much narrower than a bandwidth 612 of the second spectrum 602, which is 664 nm. Thus, high index contrast material combinations should be selected for the blocking filters 206A and 206B. It is noted that the wider bandwidth of the second spectrum 602 is achieved at a much thinner filter, only 1.7 micrometers for silicon/silicon dioxide stack, as compared to 4.9 micrometers thickness of tantalum pentoxide/silicon dioxide stack.

The variable filter thickness reduction afforded by the three-material system (in going from the lowest refractive index to the highest: silicon dioxide, tantalum pentoxide, and silicon) will now be illustrated. Turning to FIGS. 7A and 7B, spatial refractive index plots 700A and 700B are dependencies of refractive index n as a function of a stack depth coordinate d. In FIGS. 7A and 7B, the spatial refractive index plots 700A and 700B are drawn to a same scale to illustrate the total thickness reduction achievable by this invention. The refractive index plot 700A of FIG. 7A corresponds to a variable optical filter implemented using silicon dioxide/tantalum pentoxide two-material system. Silicon dioxide layers are represented by lower black bars 701, and tantalum pentoxide layers are represented by higher gray bars 702. The refractive index plot 700A includes a first blocking section 726A, a bandpass section 724, and a second blocking section 726B. The bandpass section 724 includes two thicker tantalum pentoxide layers 702 that function as bandpass filter cavity (spacer) layers 702A. The bandpass section 724 is, therefore, a two-cavity bandpass filter. Each spacer layer 702A has a reflector stack on each side; the reflector stacks are somewhat symmetrical about the spacers. The reflector stacks in between the two spacers 702A combine into one reflector stack 724C. The total length of the refractive index plot 700A of FIG. 7A, corresponding to the thickness of a two-material variable optical filter, is as large as 40 micrometers.

The refractive index plot 700B of FIG. 7B corresponds to a variable optical filter implemented using silicon dioxide/tantalum pentoxide/silicon three-material system. Referring to FIG. 7C, which is a magnified view of FIG. 7B, the silicon dioxide layers are represented by the lowest black bars 701, the tantalum pentoxide layers are represented by the higher gray bars 702, and the silicon layers are represented by the highest black bars 703.

The refractive index plot 700B includes a first blocking section 746A, a bandpass section 744, and a second blocking section 746B. Referring momentarily back to FIG. 2, the first blocking section 746A corresponds to the first blocking filter 206A, the bandpass section 744 corresponds to the bandpass filter 204, and a second blocking section 746B corresponds to the second blocking filter 206B of the optical variable filter 200 of FIG. 2. The first 746A and second 746B blocking sections include alternating silicon dioxide layers 701 and the silicon layers 703. The bandpass section 744 includes the silicon dioxide layers 701, the tantalum pentoxide layers 702 and the silicon layers 703. One difference between the bandpass section 744 of the optical filter 700B of FIGS. 7B and 7C and the bandpass filter 204 of the optical filter 200 of FIG. 2 is that the bandpass section 744 of the optical filter 700B is a two-cavity bandpass filter, similarly to the two-cavity bandpass section 724 of the optical filter 700A of FIG. 7A using, however, not two but three different materials, as explained below.

The bandpass section 744 includes first 744A and second 744B cavities, each including the tantalum pentoxide spacer 702A between two quarter-wave reflector sections. A silicon layer 751 is introduced into each reflector section. As the reflector sections are somewhat symmetrical about the spacer layer 702A, this adds four silicon layers 751 to the bandpass section 744, as shown. Introducing at least one, and preferably several optional high-index silicon layers in place of the H layers 702 into the quarter-wave reflector sections of the bandpass section 744 allows the same reflectance to be achieved with fewer layers, due to the higher index ratio of silicon to silicon dioxide (S/L) compared to tantalum pentoxide to silicon dioxide (H/L). The optical transmission loss due to inclusion of the four additional silicon layers 751 can be reduced by placing the additional silicon layers 751 in area(s) corresponding to local minima of optical field, that is, in the valley of the standing optical wave at the transmission wavelength $\lambda_T$ inside the bandpass section 744. The total length of the refractive index plot 700B of FIG. 7B, corresponding to the thickness of a three-material variant of the variable optical filter 200 of FIG. 2, is only 10 micrometers, that is, four times thinner than in FIG. 7A.

Figure 7D:
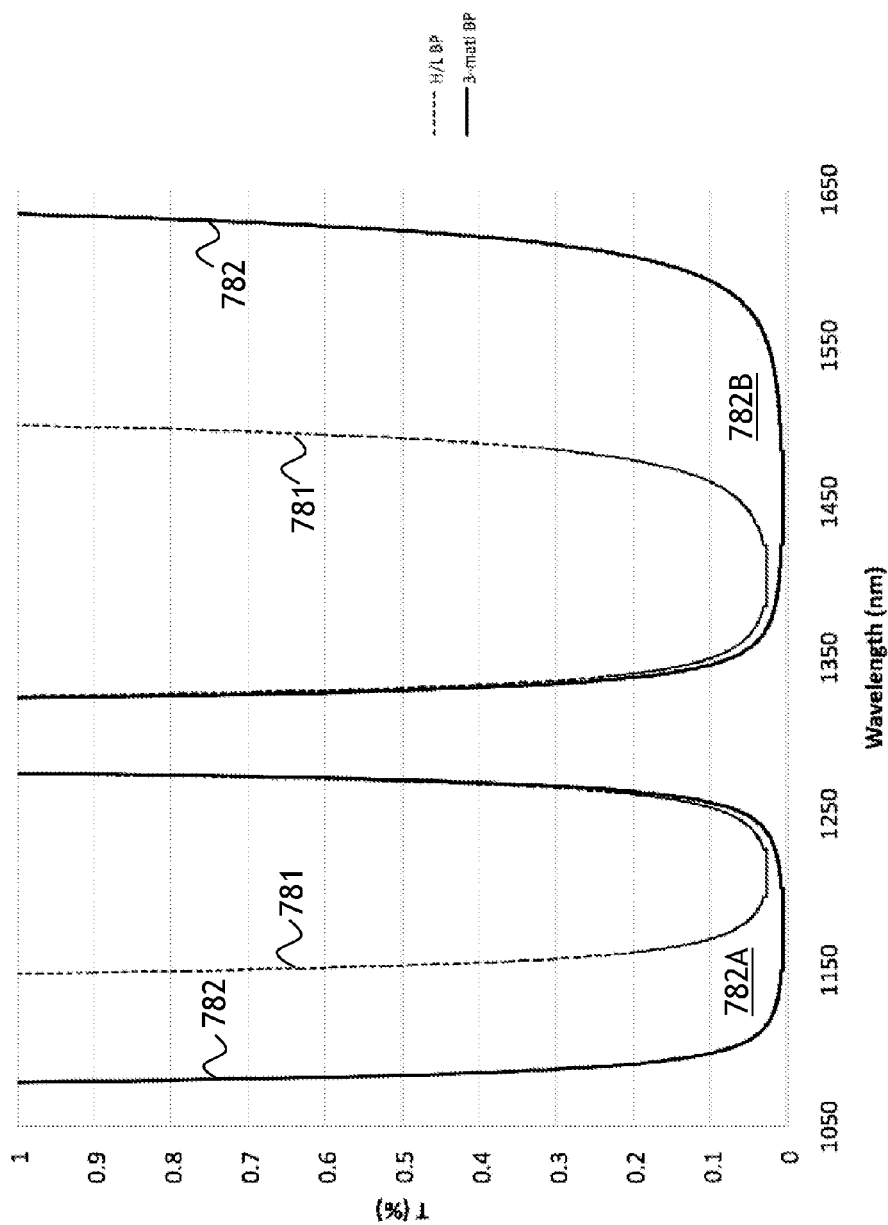
FIG. 7D is transmission spectra of bandpass sections of the variable optical filters of FIGS. 7A and 7B.

One further advantage of the additional silicon layers 751 is that the higher index ratio of the silicon/silicon dioxide combination broadens a blocking region of the bandpass filter section 744 and reduces required blocking wavelength bands of the lower 746A and upper 746B blocker sections. Referring to FIG. 7D, the transmission scale is 0% to 1% transmission, to better show the stopband performance. A dashed line 781 is a transmission plot of the bandpass filter section 724 of the variable optical filter 700A of FIG. 7A implemented with two materials (tantalum pentoxide and silicon dioxide). A solid line 782 is a transmission plot of the bandpass filter section 744 implemented as shown in FIG. 7C. One can see that using the optional silicon layers 751 allows one to considerably expand the blocking bandwidth, and the blocking strength, of wings 782A, 782B of the bandpass spectrum 782. All this achieved at a smaller overall thickness of the bandpass filter section 744 of the variable optical filter 700B of FIGS. 7B and 7C.

Referring back to FIG. 2, the resulting thickness of the filter 200 depends on the materials used, and on the target optical specifications. For example, the first layer 211 of the bandpass optical filter 204 can include silicon dioxide, the second layer 212 can include tantalum pentoxide or niobium pentoxide, the third layer of the blocking optical filter 206 can also include silicon dioxide (same as the first layer 211), and the fourth layer 214 of the blocking optical filter 206 can include silicon. The resulting three-material system allows one to reduce the thickness of the variable optical filter 200. For a near-infrared wavelength range of 900 nm to 1700 nm, the bandpass filter 204 can include no more than 20 layers, and the blocking filters 206A, 206B can include the total of no more than 60 layers. The total thickness of the filter 200 is preferably no greater than 20 micrometers at a location corresponding to the transmission wavelength of 1300 nm, and more preferably no greater than 10 micrometers. The number of layers and thickness will be driven by many factors, such as bandpass width, blocking level required, and the wavelength coverage of the variable optical filter 700B.

Figure 8A:
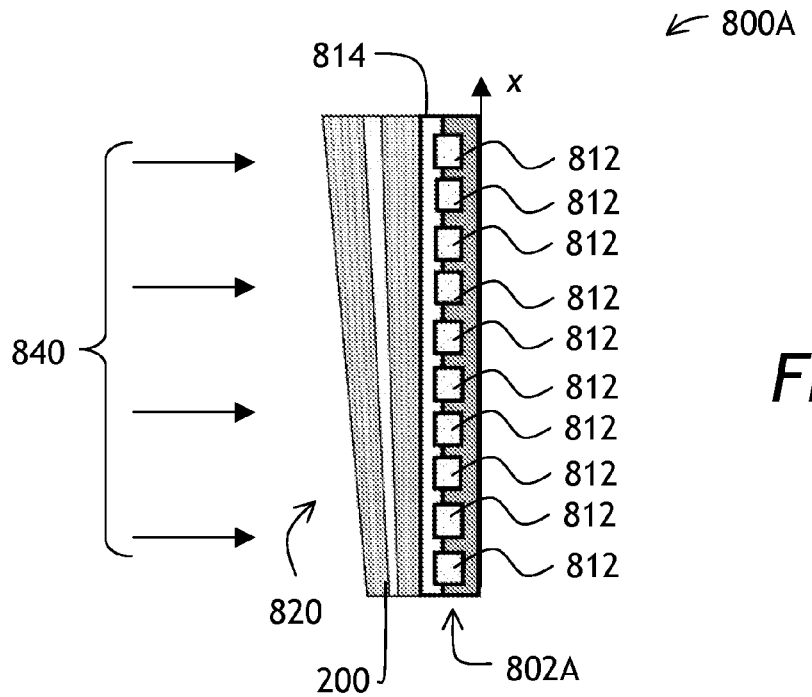
FIGS. 8A to 8D are side cross-sectional views of various embodiments of wavelength selective sensors of the invention including the variable optical filter of FIG. 2 or FIG. 7B.

Turning now to FIG. 8A with further reference to FIG. 2, a wavelength-selective sensor 800A of the invention includes the variable optical filter 200 of FIG. 2 or 700B of FIGS. 7B, 7C, and a photodetector array 802A coupled to the variable optical filter 200 with photodetectors 812 spaced apart along the x direction, in which the layer thickness monotonically increases. Since the transmission wavelength $\lambda_T$ varies along the direction x, different photodetectors 812 of the photodetector array 802A are responsive to different wavelengths of light 840 impinging on the optical filter 200 from a side 820 opposite to the photodetector array 802A. The number of the photodetectors 812 can vary from only two or three photodetectors, for detecting several isolated wavelength bands, to hundreds or more photodetectors, for performing detailed optical spectral measurements. In the latter case, the wavelength-selective sensor 800A essentially functions as an optical emission spectrometer.

In the embodiment of a spectrometer, when the number of photodetectors 812 is in tens, hundreds, or higher number of photodetectors, the transmission wavelength $\lambda_T$ can be made logarithmically variable along the length dimension x of the variable optical filter 200. When the logarithmic variation the transmission wavelength $\lambda_T$ is combined with even spacing of photodetectors 812 of the photodetector array 802A, the resolving power $R=\lambda_T/\Delta\lambda$ of spectral points collected by the optical spectrometer 800 is a constant value, which may be preferable e.g. for space applications.

The photodetector array 802 can include a substrate for the optical filter 200. In other words, the photodetector array 802 can function as a substrate supporting the optical filter 200. A gap 814 between the optical filter 200 and the photodetector array 802 can be filled with an optional adhesive layer. Alternatively, a mechanical encasing, not shown, can be used to support the optical filter 200 over the photodetector array 802. In the latter embodiment, the gap 814 can include vacuum, air, gas, etc. Furthermore, the photodetector array 802 can be used a substrate during deposition of the first 211 to fourth 214 layers of the optical filter 200. In this embodiment, the gap 814 can, but does not have to, include a planarization layer, for a better uniformity of deposition of the first 211 to fourth 214 layers. When the planarization layer fills the gap 814, different photodetectors 812 of the array 802 can have different heights. For instance, referring to FIG. 8B, photodetectors 812A, 812B, and 812C of an array 802B of a wavelength-selective sensor 800B have different heights, and the planarization layer filling the gap 814 ensures that the optical filter 200 is deposited onto an even surface 815.

Figure 8B:
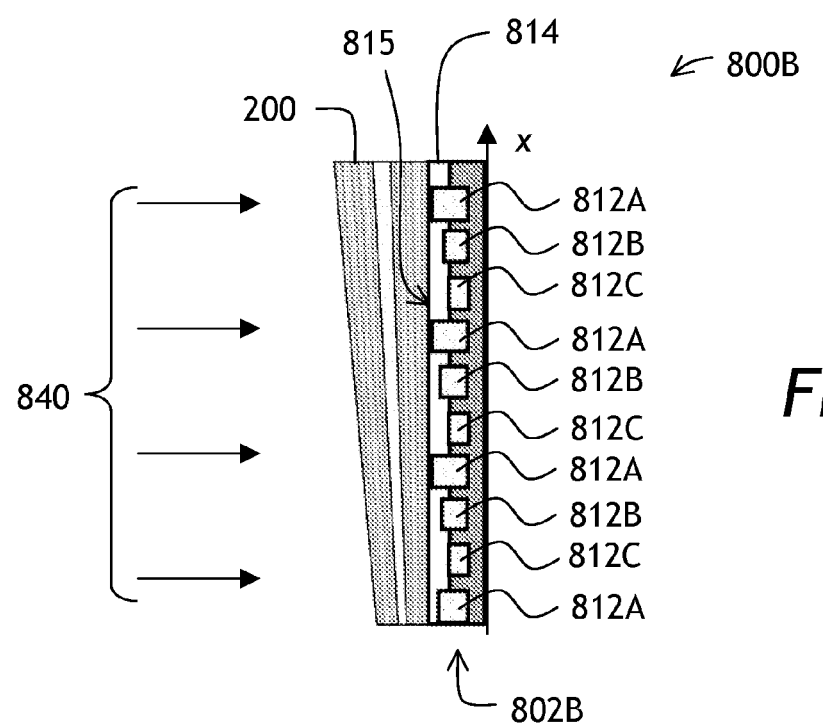
Figure 8C:
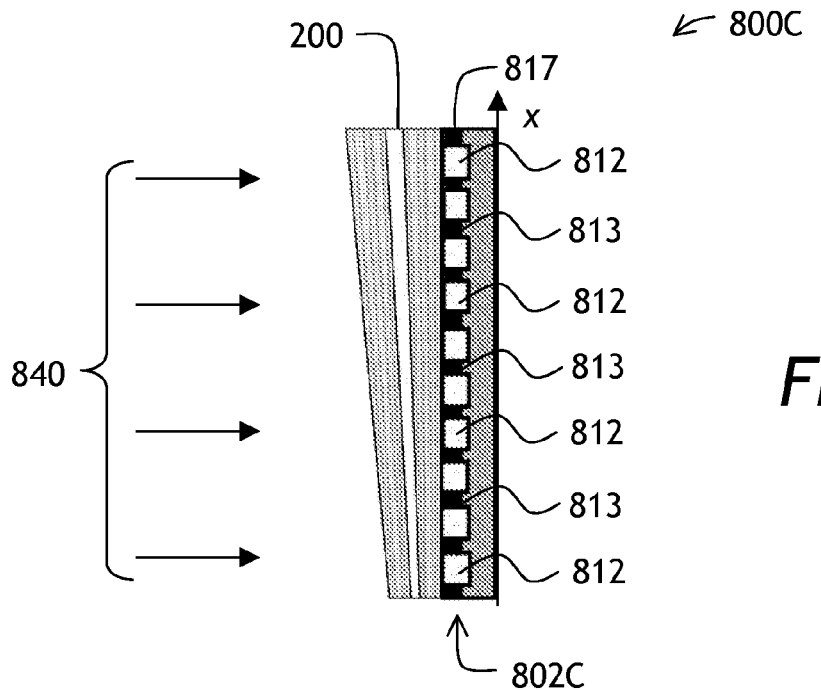

Referring to FIG. 8C, a wavelength-selective sensor 800C of the invention is similar to the wavelength-selective sensors 800A and 800B of FIGS. 8A and 8B, respectively. In the wavelength-selective sensor 800C of FIG. 8C, the photodetectors 812 of a photodetector array 802C are separated by laterally spaced gaps 813, and an opaque isolation material 817 is disposed in the gaps 813, for electrical and/or optical isolation of the individual photodetectors 812 of the array 800C. The opaque isolation material can include a black or electrically-isolating epoxy, e.g. 353NDB epoxy manufactured by Epoxy Technology, Massachusetts, USA.

Figure 8D:
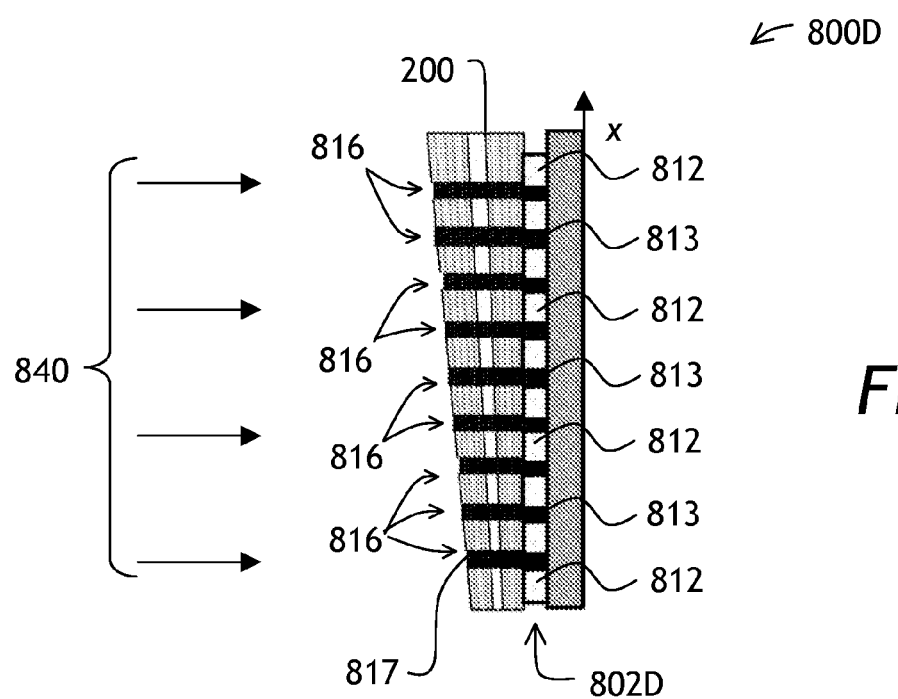

Turning to FIG. 8D, a wavelength-selective sensor 800D of the invention is similar to the wavelength-selective sensors 800C of FIG. 8C. In the wavelength-selective sensor 800D of FIG. 8D, portions of the optical filter 200 are removed, e.g. etched through, forming slots 816 each disposed directly above a corresponding one of the gaps 813 between the pixels 812 of a photodetector array 802D, and the optional opaque isolation material 817 is disposed in the slots 816, for better optical isolation and reduction of optical crosstalk between the individual photodetectors 812.

Figure 9A:
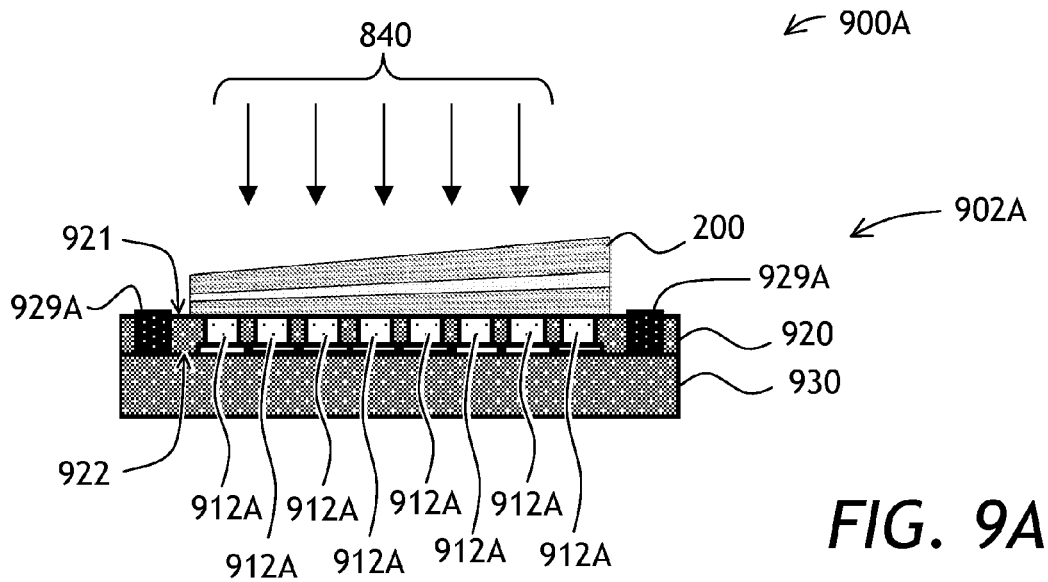
FIGS. 9A and 9B are side cross-sectional views of embodiments of wavelength selective sensors having a back-polished photodetector array (FIG. 9A) and a flip-chip mounted multiplexer circuit (FIG. 9B)

Referring to FIG. 9A, a wavelength-selective sensor 900A of the invention is a variant of the wavelength-selective sensor 800A of FIG. 8A. The wavelength-selective sensor 900A of FIG. 9A includes the optical filter 200 of FIG. 2 and an array 902A of photodetectors 912A. The array 902A is effectively a substrate for the optical filter 200. The optical filter 200 can be disposed directly on the array 902A, thus obviating a need of a separate thick substrate, e.g. a separate glass substrate at least 0.8 mm thick, for supporting the optical filter 200. The array 902A includes a device chip 920 having opposed first 921 and second 922 surfaces. The photodetectors 912A of the array 902A are disposed in the first surface 921 of the device chip 920. The optical filter 200 is disposed on the first surface 921 over the photodetectors 912A. Bond pads 929A can extend through the device chip 920 e.g. on opposite sides of the optical filter 200, as shown in FIG. 9A. A carrier chip 930 can be bonded to the second surface 922 of the device chip 920, for strengthening the device chip 920 during optional polishing of the device chip 920, see below.

Figure 9B:
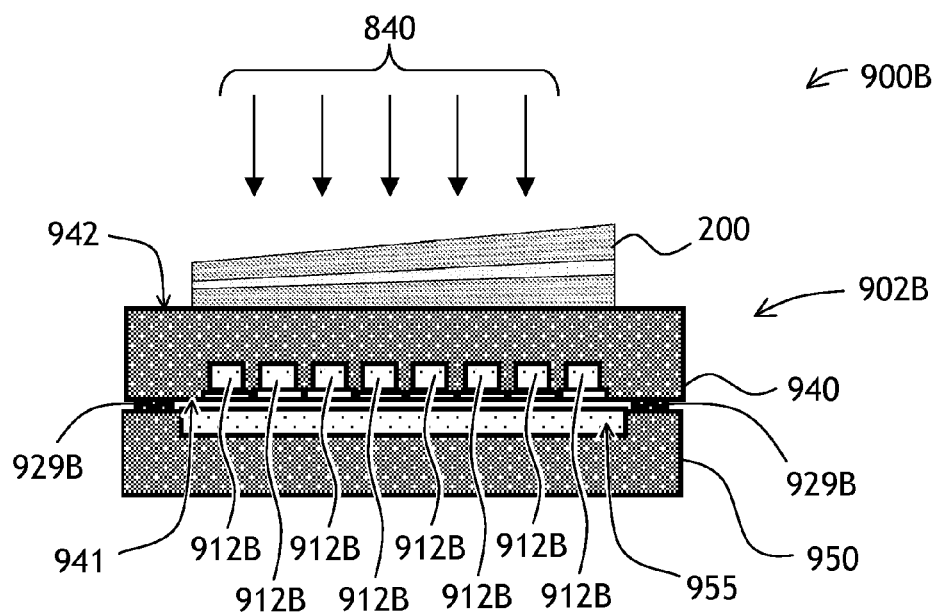

Turning now to FIG. 9B, a wavelength-selective sensor 900B of the invention is a variant of the wavelength-selective sensors 800A of FIG. 8A and 900A of FIG. 9A. The wavelength-selective sensor 900B of FIG. 9B includes the optical filter 200 of FIG. 2 and an array 902B of photodetectors 912B. The array 902B includes an array substrate 940 having opposed first 941 and second 942 surfaces. The photodetectors 912 of the array 902B are disposed within the first surface 941, and the optical filter 200 is disposed on the second surface 942 of the array substrate 940. In this embodiment, the light 840 reaches the photodetectors 912B of the array 902B by propagating through the array substrate 940.

In a preferred embodiment, the wavelength-selective sensor 900B also includes a multiplexer chip 950 including multiplexer circuitry 955 for reading photoelectric signals of the photodetectors 912B of the array 902B. The multiplexer chip 950 is flip-chip bonded to the first surface 941 of the array substrate 940. Bond pads 929B can extend between the multiplexer chip 950 and the array substrate 940, for establishing electrical contacts between the multiplexer chip 950 and the photodetectors 912B of the array 902B.

The variable optical filter 700B of FIG. 7B can be used instead of the variable optical filter 200 in the wavelength-selective sensors 800A to 800D, 900A, 900B of FIGS. 8A to 8D and 9A, 9B respectively. The filters 200, 700B can be implemented not only in a three-material system, but also in a material system including four and more materials. The first material can include silicon dioxide, the second material can include tantalum pentoxide, and the third material can include silicon. With a proper selection of materials, the variable optical filter 200 can have a thickness of no greater than 20 micrometers, and preferably 10 micrometers or less, greatly reducing mechanical stresses in the variable optical filter 200 and increasing manufacturing yields.

Preferably, the variable optical filters 200 or 700B are disposed directly on the photodetector arrays 802A to 802D; 902A, and 902B of FIGS. 8A to 8D; 9A, and 9B, respectively. In these embodiments, the photodetector arrays 802A to 802D; 902A, and 902B are effectively substrates for the variable optical filters 200 or 700B during deposition of the first 211 and second 212 layers in alternation and the third 213 and fourth 214 layers in alternation, so as to form the bandpass 204 and blocking filters 206A, 206B, respectively, on the provided photodetector arrays 802A to 802D; 902A, and 902B. Disposing the optical filters 200 or 700B directly on the photodetector arrays 802A to 802D; 902A, and 902B of FIGS. 8A to 8D; 9A, and 9B results in a more compact overall construction and improves spectral resolution of the corresponding wavelength-selective sensors 800A to 800D, 900A, and 900B, since light travels a shorter distance to the photodetectors 812, 812A, 812B, 812C, 912A, and 912B, and diverges less as compared to the embodiment of the optical filter 200 including the optional bulk substrate 202 (FIG. 2).

Figure 10A:
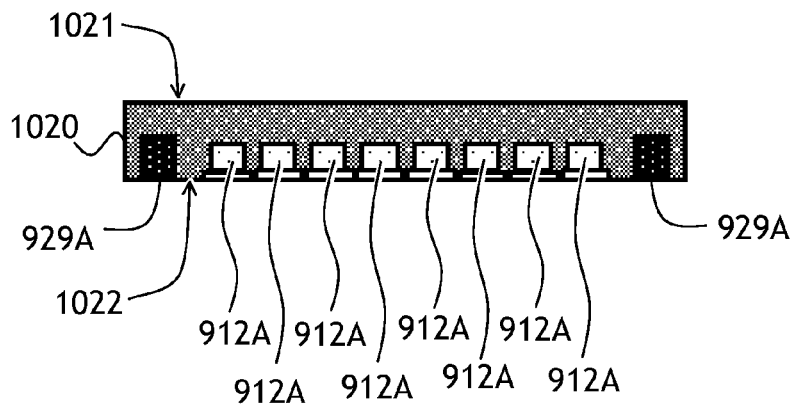
FIGS. 10A to 10C are side cross-sectional views of a wafer including wavelength selective sensors of FIG. 9A at different stages of manufacturing.
Figure 10B:
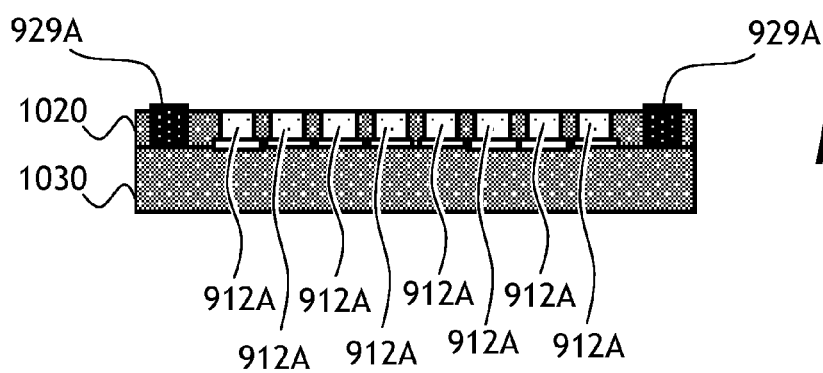
Figure 10C:
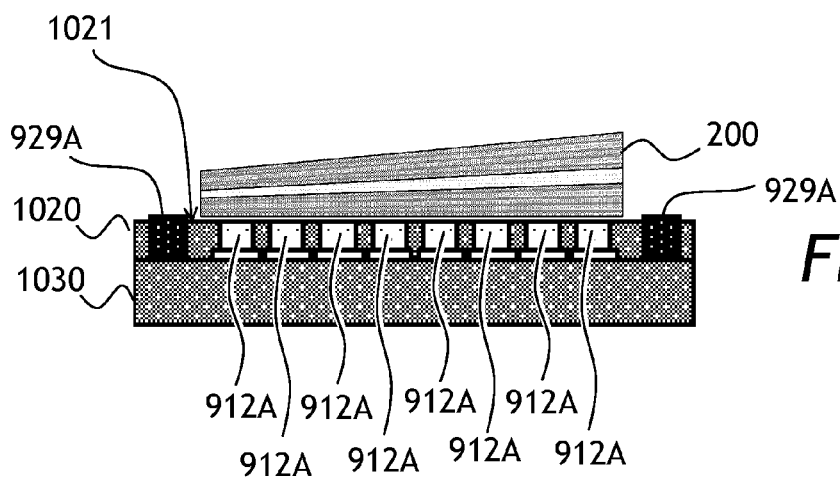

Referring to FIGS. 10A, 10B, and 10C with further reference to FIG. 9A, a method of manufacturing of the wavelength-selective sensor 900A (FIG. 9A) is illustrated. A device wafer 1020 (FIG. 10A) is provided having first 1021 and second 1022 opposing surfaces. Then, the photodetectors 912A and the optional bond pads 929A are formed in the second surface 1022 such that the photodetectors 912A face the first surface 1021 from inside of the device wafer 1020 (FIG. 10A). Then, the device wafer 1020 is bonded to an optional carrier wafer 1030, and the first surface 1021 is polished off so as to expose the photodetectors 912A of the array 902, as well as the bond pads 929A (FIG. 10B). The carrier wafer 1030 is bonded to provide mechanical strength for ease of polishing. Then, the optical filter 200 is deposited on the first surface 1021 (FIG. 10C) between the bond pads 929A, layer by layer. The device wafer 1020 can then be diced into individual device chips 920.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optical filter comprising:
a bandpass filter including a first layer comprising a first material and a second layer comprising a second material,
wherein the first layer and the second layer having first laterally varying thicknesses for providing a laterally variable transmission wavelength; and
a blocking filter including a third layer comprising a third material and a fourth layer comprising a fourth material, wherein
the third layer and the fourth layer have second laterally varying thicknesses, coordinated with the first laterally varying thicknesses, for blocking wavelengths, within a wavelength range, that are different than the laterally variable transmission wavelength, and
the bandpass filter further includes an additional layer, comprising the fourth material, disposed in an area of a local minimum of a standing optical wave inside the bandpass filter.

2. The optical filter of claim 1, wherein the optical filter is disposed on a substrate.

3. The optical filter of claim 2, wherein the substrate is a photodetector array.

4. The optical filter of claim 1, wherein
the blocking filter is a first blocking filter, and
the optical filter further includes a second blocking filter.

5. The optical filter of claim 4, wherein the bandpass filter is located between the first blocking filter and the second blocking filter.

6. The optical filter of claim 1, wherein
the blocking filter includes a plurality of portions,
each portion, of the plurality of portions, is associated with a blocking band, and
each blocking band is cascaded to cover a particular wavelength range.

7. The optical filter of claim 1, wherein the first material, the second material, and the third material are each different.

8. The optical filter of claim 1, wherein the bandpass filter includes a dielectric spacer layer located between first and second reflector stacks.

9. The optical filter of claim 1, wherein the bandpass filter includes a plurality of cavities.

10. An optical filter comprising:
a bandpass filter; and
a blocking filter, wherein
the bandpass filter comprises:
a first layer comprising a first material,
a second layer comprising a second material, and
a third layer disposed in an area of a local minimum of a standing optical wave inside the bandpass filter, and
the blocking filter comprises:
a fourth layer comprising a third material, and
a fifth layer comprising a fourth material.

11. The optical filter of claim 10, wherein
the third layer comprises the fourth material, and
the first material, the second material, and the fourth material are each different.

12. The optical filter of claim 10, wherein
the first layer and the second layer have laterally varying thicknesses, and
the fourth layer and the fifth layer have other laterally varying thicknesses coordinated with the laterally varying thicknesses.

13. The optical filter of claim 10, wherein
the blocking filter is a first blocking filter,
the optical filter further includes a second blocking filter, and
the bandpass filter is located between the first blocking filter and the second blocking filter.

14. The optical filter of claim 10, wherein the optical filter is disposed on a substrate.

15. The optical filter of claim 14, wherein the substrate is a photodetector array.

16. The optical filter of claim 10, wherein
the blocking filter includes a plurality of portions,
each portion, of the plurality of portions, is associated with a blocking band, and
each blocking band is cascaded to cover a particular wavelength range.

17. The optical filter of claim 10, wherein the bandpass filter includes:
a dielectric spacer layer located between first and second reflector stacks, and
a plurality of cavities.

18. A method of manufacturing an optical filter, the method comprising:
providing a substrate, a bandpass filter, and a blocking filter;
depositing the bandpass filter on the blocking filter, wherein the bandpass filter comprises:
a first layer comprising a first material,
a second layer comprising a second material, and
a third layer disposed in an area of a local minimum of a standing optical wave inside the bandpass filter; and
depositing the blocking filter on the substrate, wherein the blocking filter comprises:
a fourth layer comprising a third material, and
a fifth layer comprising a fourth material.

19. The method of claim 18, further comprising:
forming, in the substrate, an array of photodetectors; and
polishing a surface to expose the array of photodetectors.

20. The method of claim 18, further comprising:
forming, in the substrate, a bond pad.

* * * * *